INVENTORS
Edward D. Chalmers
Elmer Bastian
Johannes H. Hendricks
Henry H. Jap
BY Hofgren, Wegner, Allen, Stellman & McCord
ATTORNEYS Oct. 27, 1970 E. D. CHALMERS ET AL 3,537,044

ALL CHANNEL TUNER

Filed March 12, 1968 5 Sheets-Sheet 2

Oct. 27, 1970 E. D. CHALMERS ET AL 3,537,044

ALL CHANNEL TUNER

Filed March 12, 1968 5 Sheets-Sheet 4

United States Patent Office 3,537,044
Patented Oct. 27, 1970

3,537,044
ALL CHANNEL TUNER

Edward D. Chalmers, Crystal Lake, and Elmer Bastian, Union, Ill., Johannes H. Hendriks, Dordrecht, Netherlands, and Henry H. Tap, Cary, Ill., assignors to Oak Electro/Netics Corp., a corporation of Delaware
Filed Mar. 12, 1968, Ser. No. 712,436
Int. Cl. H03j 5/00, 5/10
U.S. Cl. 334—43 18 Claims

ABSTRACT OF THE DISCLOSURE

A multiband capacitor tuned television tuner having adjustable stator lines which are tuneable across the UHF band wherein the lines are connectable to lumped circuit elements to tune the VHF band. Two flexible leaves on the ends of each tuned stator line and extending through an opening in a shield form a band switch and are actuated by a switch operator between a UHF tuning position wherein the leaves are connected with the shield and a VHF tuning position wherein the leaves are connected with lumped circuit elements by means of a second switch.

Commercial television broadcasting stations in the United States and many other countries operate in both the very high frequency (VHF) and the ultra high frequency (UHF) portions of the frequency spectrum. In the United States VHF channels 2 through 6 cover the frequencies 54 megahertz to 88 megahertz and channels 7 through 13 cover the range from 174 megahertz to 216 megahertz, making up the two portions of the VHF band. UHF channels 14 through 83 cover a frequency range from 470 megahertz to 890 megahertz. In a television receiver a tuner is adjusted to select a desired channel. In current or prior art practice, two tuners are generally used, one for the VHF channels and the other for the UHF. Many tuners have been proposed which cover the entire television range with a single tuning mechanism. Recent examples of such tuners are found in the following patents:

Carlson, 3,252,095; Carlson, 3,252,096; Rehm et al., 3,275,958. Such tuners have not been used commercially in the United States.

A typical television tuner, either VHF or UHF, has two or three circuits which are tuned to the frequency of the channel to be received, and an oscillator tuned circuit which is offset therefrom by the frequency of the intermediate frequency amplifier. In each of the patents identified above, the tuned circuits include a line section having distributed impedance and tuned by a grounded capacitor, for the UHF band. The same adjustable capacitors are used in the VHF band with lumped circuit elements connected to the line sections.

A major problem with such tuners is the accurate establishment of the UHF frequencies. When the band switch is moved to the UHF position and the tuned line is connected with an electrical reference through the switch, the physical dimensions of and electrical characteristics of this connection are subject to variations as a result of the physical and mechanical difficulty of positioning the switch in precisely the same location each time. Small positional differences resulting from inaccurate detenting and electrical variations or deterioration caused thereby and by switch contact resistance and the like, make inaccurate UHF channel calibration and degrade UHF operation.

Moreover, attempts to provide all channel tuning have been subject to performance degradation caused by low unloaded Q at UHF and parasitic absorptions attributable to poor isolation between the active and the inactive tuned circuit elements.

A principal feature of the present invention is the provision of a multiband tuned circuit utilizing an adjustable tuning element having a line section with distributed impedance, a flexible leaf switch on the line section, a lumped impedance connectable with the adjustable tuning element and a switch operator including means alternately connecting the tuning element with the lumped impedance or, through the leaf switch, with a contact portion of an electrical reference means.

More specifically, it is a feature of the invention that the leaf switch extends from an end of the line section through an opening in a shield plate which separates the line section from the lumped impedance and the switch operator includes a cam which causes engagement of the flexible leaf switch with the shield, to ground the line for UHF operation and further includes switch contacts which connect the lumped impedance through the leaf switch with the tuned line section for VHF operation. The shield plate is a planar member with the leaf switch movable in a plane at right angles thereto. The switch operator preferably moves at right angles to the plane of leaf switch movement.

A further feature of the invention is that two opposed flexible leaves are mounted on the end of the line section and the switch operator is a rotary device having a first cam portion which urges the flexible leaves apart and into engagement with the shield for UHF operation, and a second cam which urges the leaves together and into contact with the switch through which they are connected with lumped circuit elements.

Another feature of the invention is that the tuned lines are returned to the electrical reference for UHF through a plurality of parallel contacts, minimizing resistance and enhancing the circuit Q.

Further features and advantages of the invention will readily be apparent from the following specification and from the drawings, in which.

Figure 1:
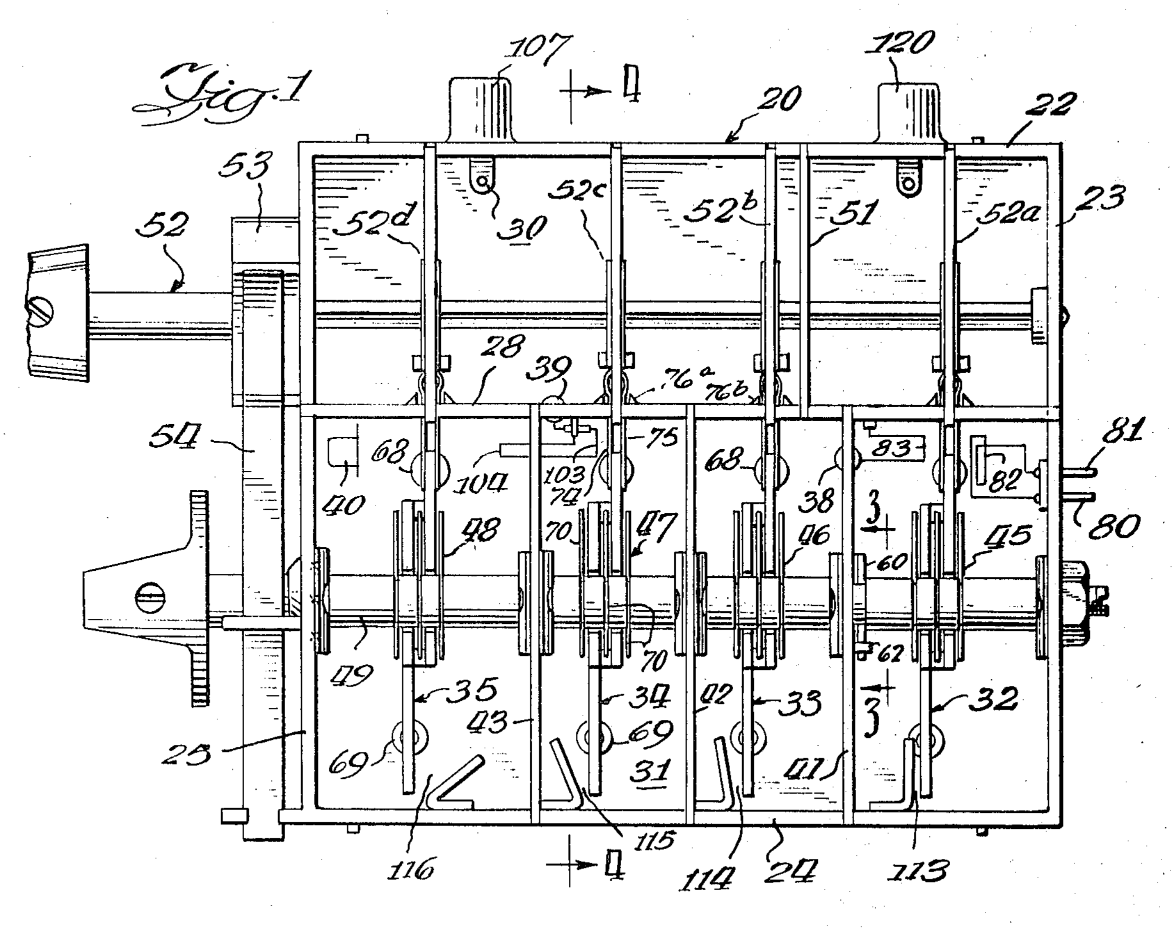
FIG. 1 is an elevation of the interior of a tuner embodying the invention, but with many lumped circuit components omitted for clarity.
Figure 2:
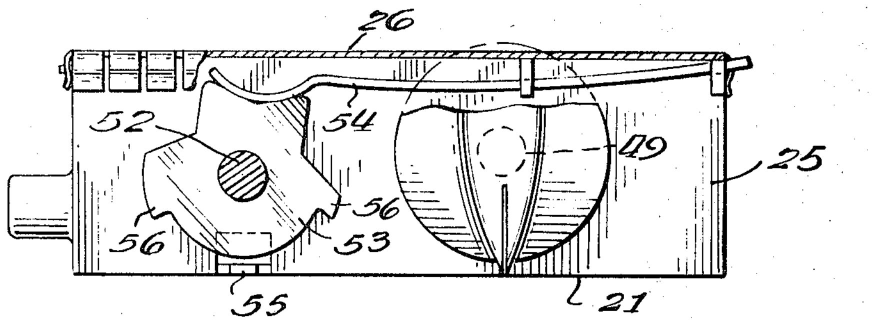
FIG. 2 is an end view from the left of FIG. 1.
Figure 3:
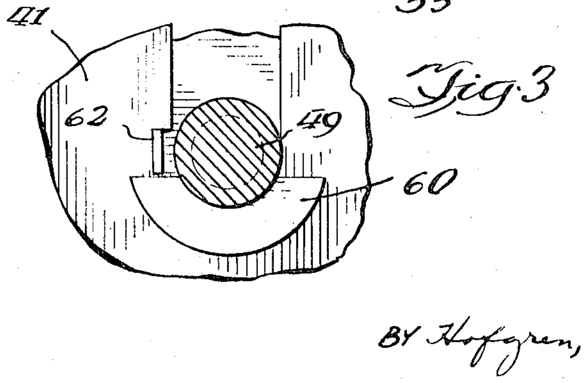
FIG. 3 is a fragmentary section taken along line 3—3 of FIG. 1.

The tuned circuit and band switch are disclosed herein as incorporated in an all-channel television tuner. The tuned circuit is particularly designed for this specific application. However, many of the features of the invention may be useful in other types of multiband tuned circuits.

Referring to FIGS. 1 to 4, the tuner circuits are located in an enclosure or housing 20 of metal, having a bottom wall 21, side walls 22, 23, 24 and 25, and cover 26. A central wall 28, also of metal, divides the housing longitudinally and serves as an electric shield between the circuits on either side thereof. In general, the chamber 30 above panel 28 contains the fixed VHF circuit components while the chamber 31 below the shield contains the adjustable channel selecting components and UHF circuitry. Many of the circuit elements are not physically illustrated in FIG. 1, to avoid unnecessarily confusing the drawing. The circuit is shown schematically in FIG. 15.

In chamber 31 there are four circuit elements 32, 33, 34 and 35 which serve as adjustable line sections for UHF operations and as variable tuning elements for VHF operation. Briefly, the antenna is tuned by adjustable element 32 which is connected with the input of RF amplifier 38. The output of amplifier 38 is tuned by element 33 which is coupled with element 34 in the input of mixer 39. Oscillator 40 is tuned by element 35. Conductive walls 41, 42 and 43 isolate each of the tuning elements. The four tuned circuits are adjusted by variable capacitors 45, 46, 47 and 48, through rotation of channel selector shaft 49 which is journaled in end walls 23 and 25 of the housing and grounded thereto.

Band selection is performed by a three-position rotary switch 52 having four sections **52*a*, 52*b*, 52*c* and 52*d*. The band selector switch serves to ground the ends of tuning elements 32, 33, 34 and 35 to the shield 28 for UHF operation and to connect lumped circuit components with the tuning elements for VHF operation. Section 52*a* and its associated circuits are isolated from the other sections by shield 51. Further details of the construction, connection and operation of the band switch section will be given below. Three positions of the band selector switch, corresponding with the two portions of the VHF television band and the UHF band, are established by a detent mechanism including a cam 53 mounted on the switch shaft and a detent spring 54 which has an end portion that bears against positioning recesses of the cam. A stop 55 extending outwardly from the wall 25 of the housing is engaged by stop projections 56 and the cam to limit the switch movement. Rotation of the channel tuning shaft 49 is limited by an arcuate plate 60 (FIG. 3) mounted on the shaft adjacent divider wall 41, the ends of which strike a stop finger 62** extending outwardly from the wall.

Figure 4:
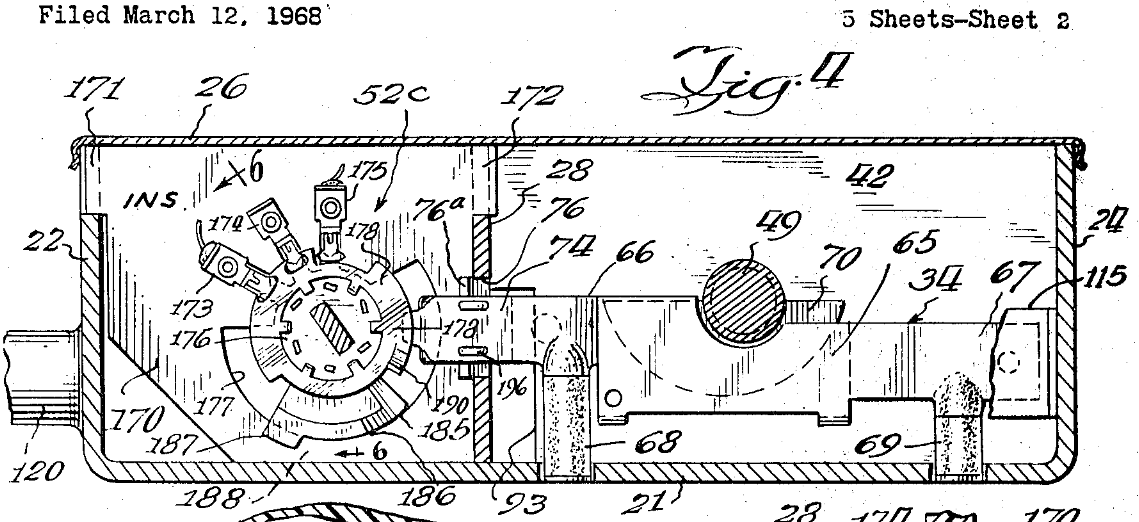
FIG. 4 is a section taken along line 4—4 of FIG. 1.
Figures 5, 6:
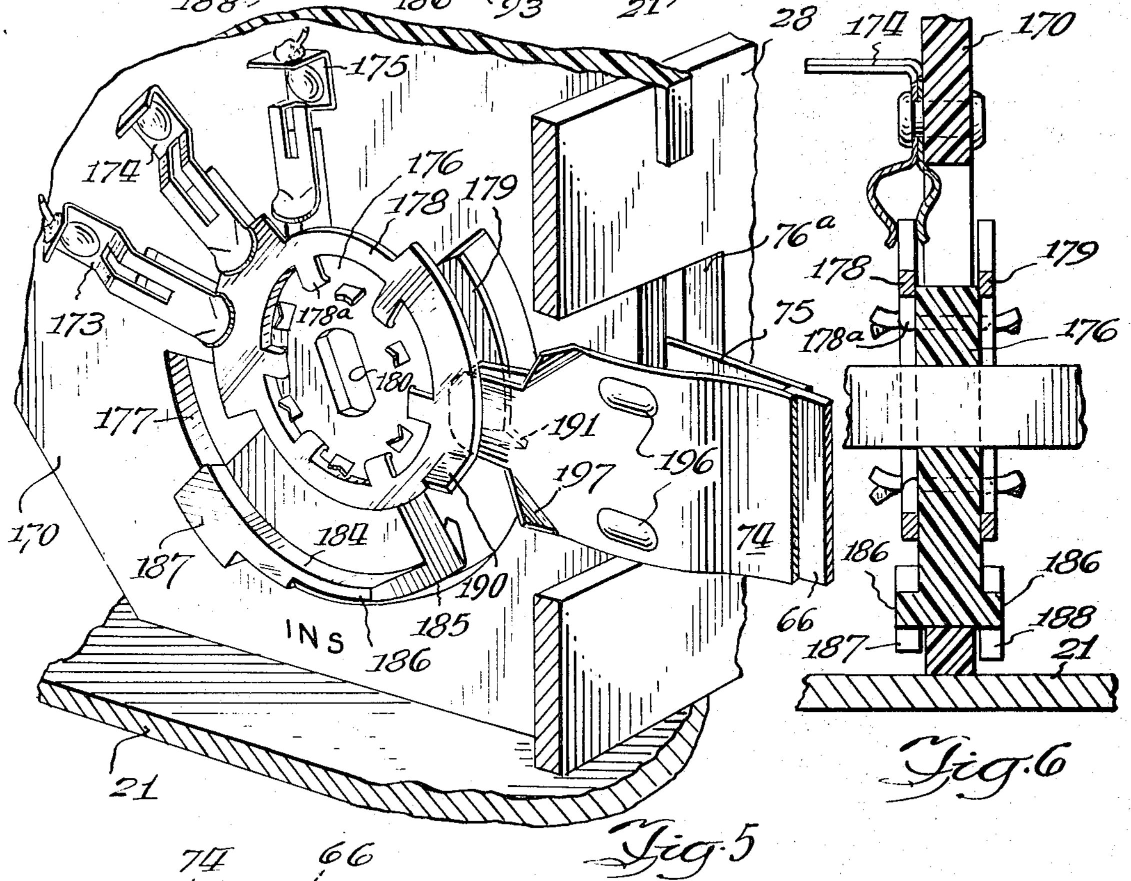
FIG. 5 is an enlarged fragmentary perspective of the band switch.
FIG. 6 is an enlarged section taken along line 6—6 of FIG. 4.

The tuning elements 32–35 are essentially the same and the line 34 illustrated in FIG. 4 is representative. The line has a folded center portion 65 with extensions 66 and 67 from either end thereof. The line is spaced from the wall 21 of the housing by a pair of stand-off insulators 68, 69. The folded center portion 65 of the line forms adjustable tuning capacitor 47 with the three plates 70 mounted on shaft 49. A pair of leaf switch members 74 and 75, on the extension 66 of tuned line 34, project through an opening 76 in the shield 28. As will appear in more detail, the band selector switch (here section **52*c*) actuates the flexible leaf switch elements 74 and 75, to ground the tuned line section for UHF operation and to connect the variable capacitor with lumped circuit components for VHF operation. The grounding of the tuned line section to shield plate 28 effectively isolates the tuned line section from the lumped circuit components during UHF operation. The size of opening 76 is so related to the leaf switch elements 74, 75** that during VHF operation the capacity between the switch elements and the shield is small relative to the capacity of the variable tuning capacitor.

Figure 15:
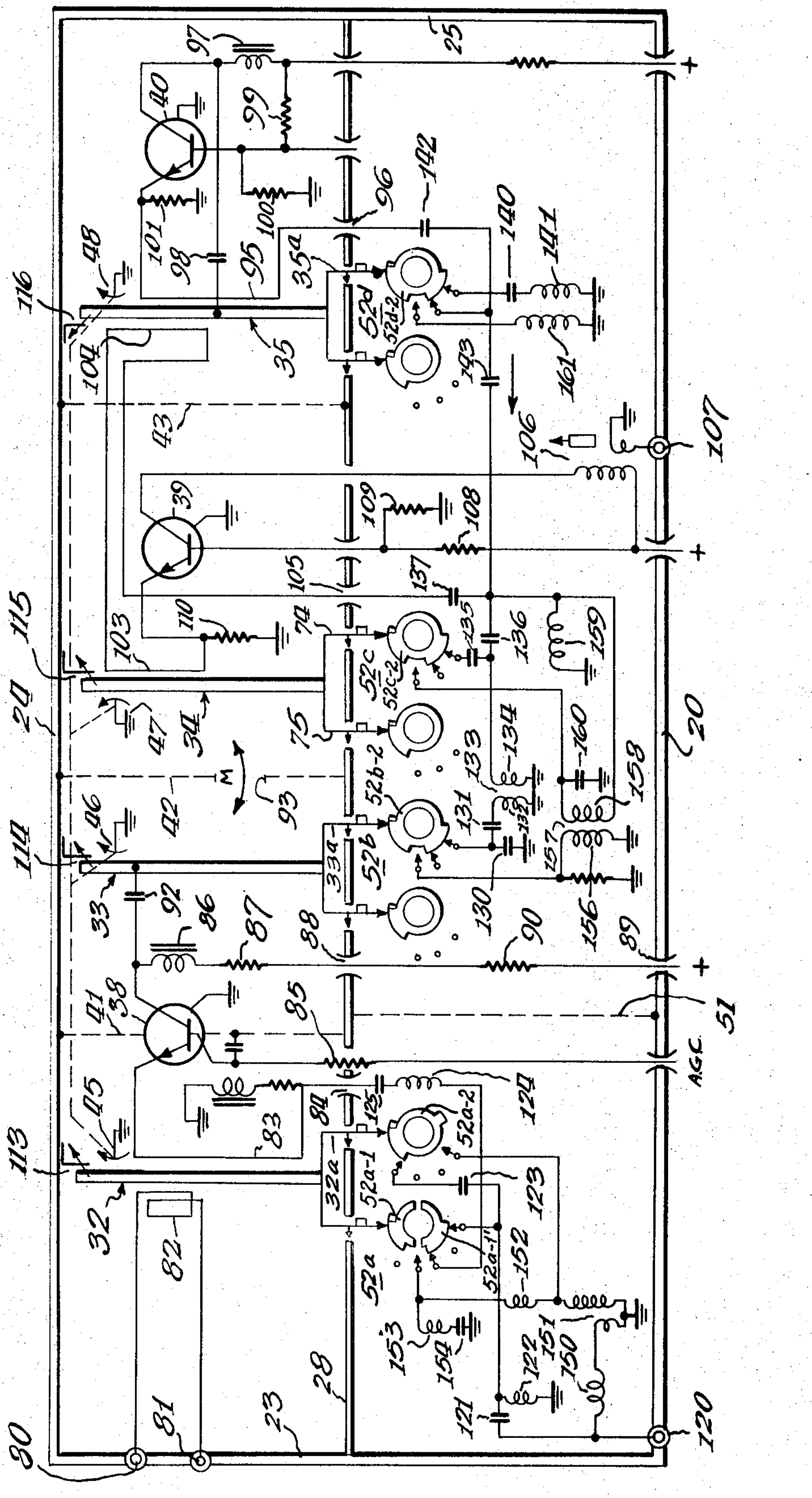
FIG. 15 is a semi-diagrammatic schematic drawing of a tuner embodying the invention.

The specific tuner circuit will be considered in connection with the semi-diagrammatic schematic drawing of FIG. 15. Physical elements identified in FIG. 1 are given the same reference numerals in FIG. 15. Similarly elements first identified in FIG. 15 are given the same reference numerals in other figures.

Each of the sections of band selector switch 52 has two rotor blade members which will be identified by the switch section number followed by the number 1 or 2 as **52*a*–2. Rotor blade 1 for switch section 52*a* is in two parts, designated 1 and 1′. The band switch is shown in band II position, the higher frequency portion of the VHF band. The band I position, the lower frequency portion of the VHF band, is 60° clockwise from the switch position shown, while band III, UHF, is 60° counterclockwise. The leaf switch elements for each tuned line are illustrated diagrammatically as extending through separate openings in shield 28 rather than a single opening as in the mechanical drawings. This illustration is used for the sake of convenience, showing the sections of band selector switch 52** in such a manner that they all rotate in the same direction as viewed in the drawing. It is intended that the two leaves of each tuned line extend through a single opening in the shield, as in the various mechanical drawings.

The circuit will be considered first as it operates in band III for UHF. The flexible leaf switch elements at the end of each tuned line 32, 33, 34 and 35 are connected with the electrical reference provided by grounded shield 28 and the lines operate as quarter-wave elements tunable across the UHF band by variable capacitors 45–48. The transmission line from a receiving antenna (not shown) is connected with input terminals 80, 81 and through a coupling loop 82 with resonant line 32, which tunes the antenna. The emitter input circuit of RF amplifier 38, transistor type A480, is coupled with line 32 through a conductive loop 83 which is returned to ground for the UHF signal at a feedthrough capacitor 84 mounted in shield 28. The base of transistor amplifier 38 is connected through a decoupling resistor 85 with a source of automatic gain control potential (not shown). The collector element of the RF amplifier is connected through a load including RF choke 86 and 87 with an operating potential, as +12 vlots. The RF signal is kept out of the power supply by feedthrough capacitors 88, 89 and series resistor 90. The amplified RF signal is coupled through capacitor 92 to the tuned line 33 which in turn is inductively coupled to tuned line 34 through an opening 93 (see also FIG. 4) in shield 42.

Local oscillator 40, transistor type A483, is tuned by line 35. The emitter of the oscillator is connected with the tuned line through a loop 95 returned to ground at feed-through capacitor 96. A feedback signal is developed in the collector circuit across RF choke 97 and is coupled through capacitor 98 to the tuned line. The collector is connected with a source of positive operating potential. Bias for the base is provided by a voltage divider of resistors 99, 100. An emitter bias is established by resistor 101, connected to ground.

Mixer 39, transistor A482, has its emitter electrode connected through series connected coupling loops 103, 104 with tuned lines 34, 35, respectively. The coupling loop circuit is grounded for UHF frequencies by feedthrough capacitor 105. The output of the mixer, at the IF frequency, is connected from the collector through tuned IF transformer 106 to an output terminal 107. Base bias is provided by resistive voltage divider 108, 109 and emitter bias is established by resistor 110 to ground.

Tuned lines 32, 33, 34 and 35 have, adjacent the open ends thereof, trimmer capacitors 113, 114, 115, 116 which are adjusted at the high end of the UHF band and establish the frequency band for each of the lines. As shown in FIG. 1, the trimmer capacitors are short lengths of metal secured to the housing wall 24 and bendable to vary the spacing to the end of the adjacent line.

The operation of the tuner on band II, the high frequency portion of the VHF band, will next be considered. Band selector switch 52 is shown in the band II position. The flexible leaf switches at the end of circuit elements 32–35 are disconnected from the ground shield 28 and the elements function primarily as variable capacitors for both VHF bands.

The VHF input, from a 75 ohm unbalanced line, is connected with antenna terminal 120. The signal is coupled through capacitor 121 with a tuned circuit including shunt inductor 122 in parallel with the combination of capacitor 123 and tuning capacitor 45, connected in series through switch rotor **52*a*–2 and the flexible switch leaf 32*a*. The incoming signal is also connected through switch rotor 52*a*–1′, inductor 124 and capacitor 125 to the emitter of RF amplifier 38. As in UHF operation, the output of the amplifier is coupled through capacitor 92 to the interstage tuned network. For the band II operation, the first tuned circuit of this network includes variable capacitor 46 connected through flexible leaf switch 33*a* and rotor blade 52*b*–2 with a circuit comprising shunt connected capacitor 130 connected in parallel with the series combination of capacitor 131 and inductor 132, which also serves as the primary winding of interstage coupling transformer 133. Secondary winding 134 of the coupling transformer is connected through series capacitor 135, switch rotor 52*c*–2 and leaf switch 74 with tuning capacitor 47. The signal is coupled through capacitor 136 and capacitor 137 to the emitter of mixer 39**.

The oscillator tuned circuit on band II includes variable capacitor 48 connected through switch leaf **35*a* and switch 52*d*–2 with the series circuit of capacitor 140 and inductor 141. The emitter of the oscillator is connected with the tuned circuit through capacitor 142 and selector switch segment 52*d*–2. Capacitor 143, connected between the tuned circuit and the emitter circuit of the mixer, couples additional oscillator signal to the mixer. The mixer output is again obtained from the mixer collector circuit through transformer 106**.

The operation of the tuner in band I is similar. The received signal is coupled from antenna terminal 120 through inductor 150, transformer 151 and selector switch **52*a*–2, with variable capacitor 45. The input signal for the RF amplifier is connected from the tuned circuit through inductor 152, switch 52*a*–1′, inductor 124 and capacitor 125 to the emitter of transistor 38. A trap comprising inductor 153 and capacitor 154**, series tuned to the IF frequency, is connected across the amplifier input.

The interstage coupling network for band I includes a tuned circuit comprising capacitor 46, connected through leaf switch **33*a* and switch rotor 52*b*–2 with the primary winding 156 with coupling transformer 157. The secondary winding 158 is connected in series with inductor 159 and together they form a tuned circuit with shunt capacitor 160 and variable capacitor 47, through switch rotor 52*c*–2. The output is obtained from across inductor 159 and coupled through capacitor 137 to the input of mixer 39. The oscillator on band I is tuned by capacitor 48 and inductor 161, which are connected in parallel through switch rotor 52*d*–2 and leaf switch 35*a***.

Further details of the design and operation of the circuit are not required for an understanding of the invention.

The mechanical construction of the flexible leaf switches and the cam operator forming a part of the band switch will now be described with particular reference to FIGS. 5, 6 and 9 through 12. The tuned lines and flexible leaf switches are identical and the only difference in the band switch sections is in the configuration of the rotor blades of section **52*a*. A description of the switch 52*c*** will suffice for all.

The band switch has a stator 170, of insulating material, positioned in the housing by tabs 171 and 172 which are received in slots in housing wall 22 and shield 28, respectively. Wiper contacts 173, 174 and 175 are mounted on the switch stator in a suitable manner. A rotor 176, of insulating material, is rotatably received in opening 177 in the stator. Conductive rotor blades 178, 179 are mounted on rotor body 176 by legs, as **178*a*, which extend through the rotor body and are deformed on the opposite side. An opening 180 in the center of the rotor receives the shaft of band switch 52. Rotor blades 178 and 179 overlap the stator around a portion of opening 177 to aid in positioning the rotor. The ends of flexible leaves 74, 75 extend through the opening 76 in shield plate 28, across a web of stator 170 and overlap the rotor opening 177**.

Rotor body 176 includes an integral cam portion 184 which moves along the periphery of rotor opening 177. Cam portion 184 has a tapered end 185 and a ramp 186 positioned outwardly from the surface of stator 170. A pair of radial extensions 187, 188 overlap the stator and cooperate with wiper blades 178, 179 in positioning the rotor. When band selector switch is moved to the band III (UHF) position, the tapered end 185 of cam portion 184 moves between leaves 74 and 75 forcing them outwardly. In the band III position, ramp 186 of the cam portion is located between the ends of the flexible leaves holding them in engagement with the vertical edges **76*a* and 76*b* of opening 76**, grounding the ends of the tuned lines for UHF operation.

Rotor blades 178 and 179 have outwardly angled tabs 190, 191 circumferentially spaced from cam portion 184. These tabs together with the adjacent surfaces of the blades parallel with stator 170 provide a second cam portion which engages the leaf switches 74 and 75 on rotation of the selector switch from band III to band II, moving the leaves away from their position of engagement with the edges **76*a* and 76*b* of the opening in shield 28. In bands I and II the tuning element is connected through leaf switch 74, rotor blade 178 and wiper contacts 173, 175** with the lumped circuit elements.

The edges **76*a* and 76*b* of the opening in shield plate 28 are bent rearwardly and rounded so that the flexible leaves 74 and 75 engage rounded vertical edge surfaces 195*a*, 195*b*. This minimizes errors in band III calibration by eliminating changes in the length of the line which would result if the contact were made in different points across the thickness of the shield. Each of the leaves 74 and 75 has a pair of outwardly extending dimples 196 therein with an arcuate cross-section for contact with surfaces 195*a*, 195*b***. This limits the contact between the leaves and the shield to four spaced points. However, as the leaves are fixedly mounted with respect to the shield, the location of these points of contact and thus the length of the tuned lines are fixed. The provision of four parallel points of contact between the leaves and the shield minimizes the effect of contact resistance and energy losses which would otherwise deteriorate the tuned circuit Q.

The edges of the leaves are flared, as at 197, to avoid interference with cam ramp 185. The ends of the leaves are bowed outwardly, as at 198, so that the leaves are deflected around the web of stator 170 by the rotor blades 178, 179 to provide adequate contact pressure for a good connection in bands I and II.

Figure 7:
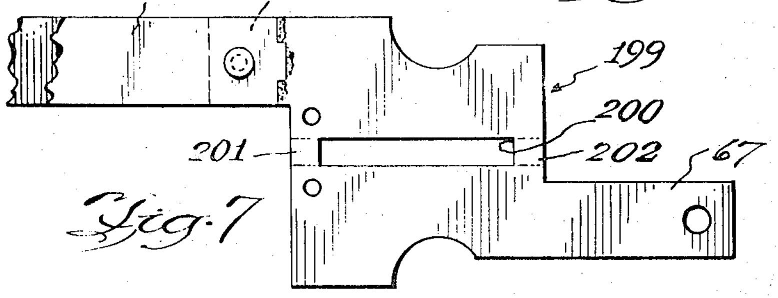
FIG. 7 is a view of the blank for a tuned line section prior to formation thereof.
Figures 8, 9:
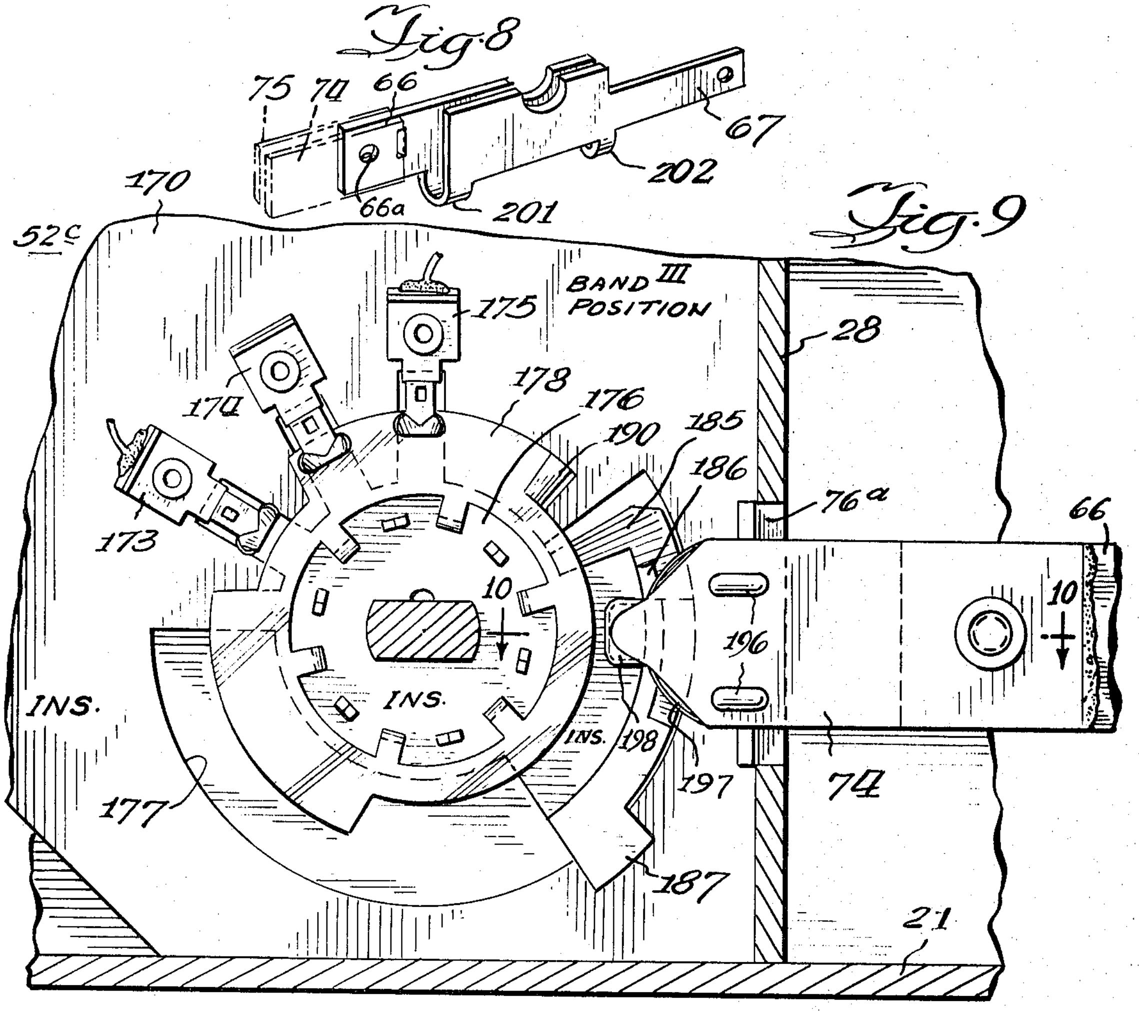
FIG. 8 is a perspective view of the formed line sections.
FIG. 9 is an enlarged fragmentary elevation of the band switch.
Figures 10, 11, 12:
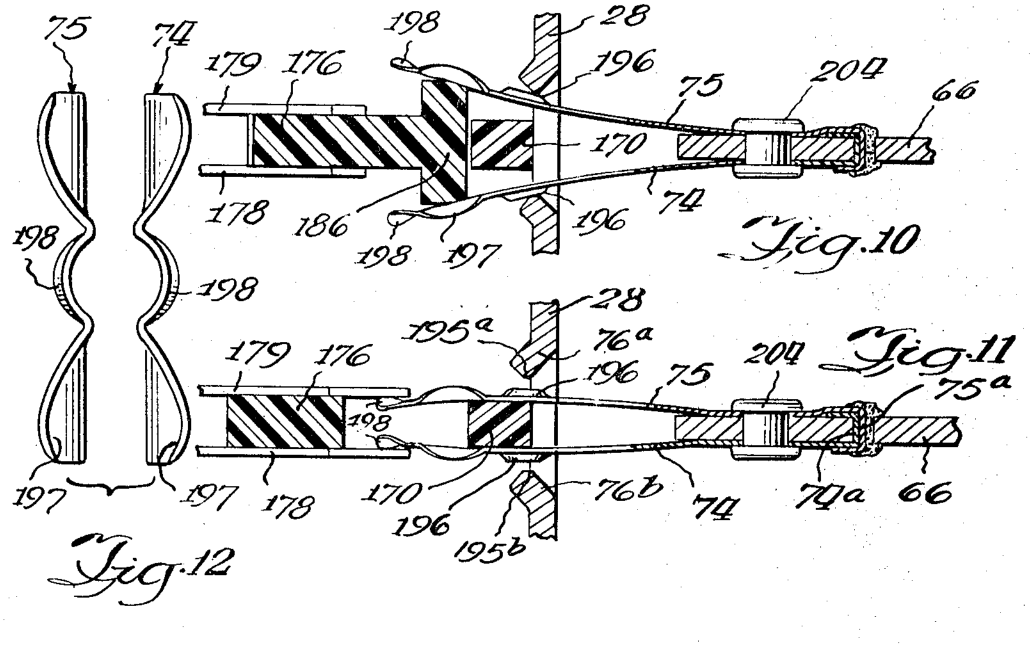
FIG. 10 is a fragmentary section taken along line 10—10 of FIG. 9.
FIG. 11 is a fragmentary section similar to FIG. 10 showing the band switch in a VHF position.
FIG. 12 is an end view of the flexible leaves.

The tuned line member is formed of a single piece of metal, shown as a blank 199 in FIG. 7. A central opening 200 is cut in the blank leaving the two portions 66 and 67 joined by webs 201, 202. This simplifies the forming process by reducing the spring-back which is encountered after the blank is bent into the U-shaped configuration. Flexible leaves 74 and 75 are provided with tabs 74*a*, 75*a* which are received in an opening 66*a*. The leaves are secured by a rivet 204 and soldered to the line member.

Figures 13, 14:
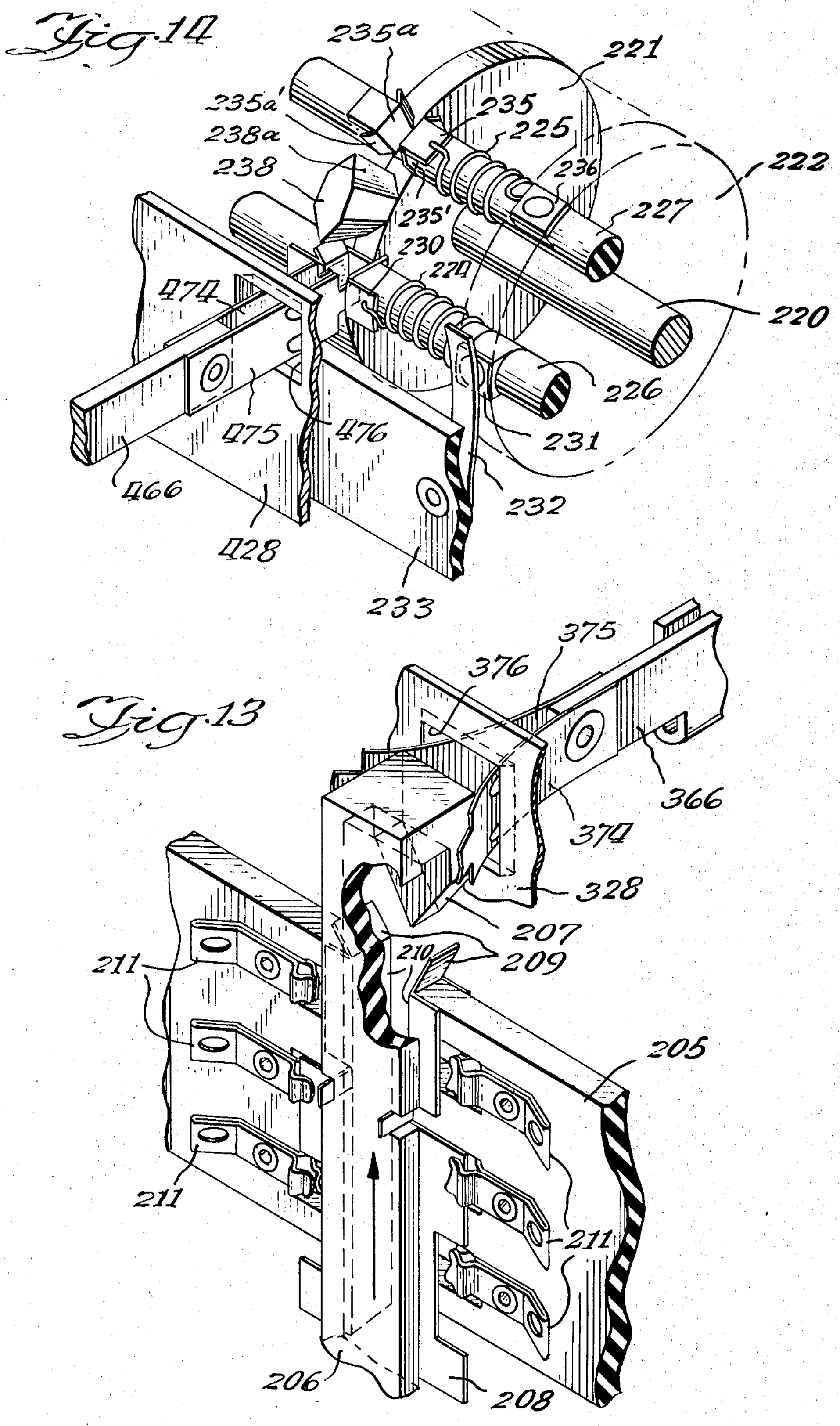
FIG. 13 is a fragmentary perspective of another form of band switch.
FIG. 14 is a fragmentary perspective of yet another form of band switch.

The invention is not limited to the use of a rotary switch operator. A slide switch configuration is shown in FIG. 13 where reference numerals 300 higher than those previously used identify parts described above. The tuned circuit is illustrated in the UHF position. The end portion 366 of the tuned line has affixed thereto a pair of flexible leaf switch members 374 and 375 which extend through opening 376 in the shield plate 328. A slide switch stator 205 of insulating material is parallel to and spaced from shield plate 328, in the VHF portion of the tuner housing. A slide switch operator 206 is mounted on stator 205, for sliding movement thereon in a plane at right angles to the plane of movement of switch leaves 374, 375. At the upper end of operator 206 is a wedge-shaped cam 207 which, in the band III, UHF position, spreads the ends of leaves 374, 375 forcing them against the sides of opening 376, grounding the tuned line. Switch operator 206 is moved upwardly as viewed in FIG. 13 to the VHF band positions. A sliding contact 208 is carried between switch operator 206 and has at its upper end divergent cam surfaces 209, spaced in the direction of slider movement from UHF cam 209, which engage the ends of leaves 374, 375 and force them inwardly for contact with vertical switch surfaces 210. Switch slider 208 cooperates with stator clips 211 mounted on stator 205 to connect the variable tuning element with lumped circuit components (not shown) for VHF operation. The band switch operators 206, although only one is illustrated, are mechanically interconnected for simultaneous operation.

Another embodiment of the invention is illustrated in FIG. 14 where the VHF coils and the UHF cam are mounted on rotary members, as in a turret tuner. In FIG. 14, reference numerals 400 higher than those previously used identify like parts. The end portion 466 of the tuned line has riveted thereto a pair of flexible leaf switch members 474, 475, extending through opening 476 in conductive shield plate 428. A rotary channel selector shaft 220 has mounted thereon a pair of discs 221, 222. Disc 221 is aligned with the leaf switches 474, 475. VHF tuning coils 224, 225 are wound on insulating rods 226, 227 carried by and rotatable with the discs 221, 222. The ends of coil 224 are connected with contacts 230, 231, through which the coil is connected electrically in the circuit. Contact 230 is adjacent leaf switch 475 and connects one end of coil 224 with the tuning capacitor (not shown). Contact 231 engages a resilient leaf switch 232 secured to an insulating board 233 and through which the coil and capacitor are connected with other circuit components. Similarly, coil 225 is provided with contacts 235, 236.

The UHF cam 238 extends radially outwardly from the edge of disc 221 for movement between the flexible leaves 474, 475, upon rotation of the band selector shaft 220. Cam 238 has tapered end surfaces, as 238*a*, to move the leaf switches apart and ground the tuned line. Contact 235 and an opposing contact 235*a* (not here connected with a coil have divergent surfaces 235' and 235*a'* which force the leaves 474, 475 together upon movement of a band selector to a VHF position. The band switching circuits for each of the tuned networks are selected by rotation of shaft 220 on which similar coil assemblies are mounted for each tuned network.

The UHF cam 238 is illustrated in FIG. 14 located between the coils 224 and 225. Any desired order may be used, and additional coils may be incorporated to tune the circuits to bands other than the three discussed above.

We claim:

1. A multiband tuned circuit, comprising: an adjustable tuning element including a line section with distributed impedance; means defining an electrical reference and having a contact surface portion adjacent an end of said line section; a flexible leaf switch fixed at one end to the line section and movable in a direction generally at right angles to said contact surface portion; a lumped impedance connectable with said adjustable tuning element; and a switch operator including means for alternately connecting said tuning element with said lumped impedance or, through said leaf switch, with the contact portion of said reference means.

2. The tuned circuit of claim 1 in which the line section has an end portion with the leaf switch mechanically and electrically secured thereto and the switch operator includes cam means for moving said leaf switch into engagement with the contact surface portion of the electrical reference means.

3. The tuned circuit of claim 1 in which the connection of the tuning element through the leaf switch with the contact surface portion of the electrical reference means includes plural parallel points of connection.

4. The tuned circuit of claim 1 in which said reference means includes an electrical shield between said adjustable tuning element and said lumped impedance.

5. The tuned circuit of claim 4 in which the leaf switch extends through an opening in the shield and the contact portion of the reference means is a boundary surface of the opening.

6. The tuned circuit of claim 5 in which the shield is a planar member, the leaf switch moves in a plane at right angles to the shield and the switch operator moves at right angles to the plane of leaf switch movement.

7. The tuned circuit of claim 6 in which the switch operator is mounted on a rotatable shaft, said shaft being parallel with said shield.

8. The tuned circuit of claim 1 in which said switch operator actuates said leaf switch between a first position connecting said line section with the contact surface portion of said electrical reference means and a second position connected with said lumped impedance.

9. The tuned circuit of claim 8 in which the switch operator has two cam portions one of which moves the leaf switch in one direction into engagement with the contact surface portion of the electrical reference means and the other of which moves the leaf switch in the opposite direction for connection with said lumped impedance.

10. The tuned circuit of claim 8 in which the switch operator includes a cam for moving the flexible leaf switch into engagement with the contact surface portion of the electrical reference means in one position of the operator, and a contact which engages the leaf switch in another position of the operator to connect the lumped impedance to the line section.

11 .The tuned circuit of claim 10 in which the switch operator is a rotary switch.

12. The tuned circuit of claim 10 in which the switch operator is a slide switch.

13. The tuned circuit of claim 10 in which the switch operator is a rotary turret.

14. The tuned circui tof claim 11 in which the electrical reference means comprises a shield between the line section and the lumped impedance and has an opening therein through which two flexible leaves mounted on the end of the line section extend, the cam of the rotary switch moving between the two flexible leaves to force them apart and into contact with the edge of said shield opening, the contact of said switch moving said leaf members away from the shield contact portion.

15. The tuned circuit of claim 1 having a pair of flexible leaf switch elements both movable into engagement with the contact surface portion of the electrical reference means movement of both leaf switch elements being generally at right angles to said contact surface portion.

16. The tuned circuit of claim 15 in which the line section has an end portion with the two opposed leaf members mechanically and electrically secured to opposite surfaces thereof and the switch operator includes cam means for moving both leaf members into engagement with the contact surface portion of the electrical reference means.

17. The tuned circuit of claim 1 in which the contact surface portion is the edge of a plate.

18. The tuned circuit of claim 17 in which the edge is rounded.

References Cited

UNITED STATES PATENTS

| | | | |
|---|---|---|---|
| 2,758,212 | 8/1956 | Winfield | 334—45 |
| 2,964,626 | 12/1960 | Webster et al. | 334—43 |
| 3,275,958 | 9/1966 | Rehm et al. | 334—45 X |
| 3,376,510 | 4/1968 | Rummer | 334—42 X |

FOREIGN PATENTS

| | | |
|---|---|---|
| 679,242 | 9/1952 | Great Britain. |

PAUL L. GENSLER, Primary Examiner

U.S. Cl. X.R.

334—3, 45, 47, 54